(12) United States Patent
Konopka

(10) Patent No.: US 7,157,896 B2
(45) Date of Patent: Jan. 2, 2007

(54) DEVICE FOR LOCATING AND IDENTIFYING CIRCUIT BREAKERS

(75) Inventor: John G. Konopka, Deer Park, IL (US)

(73) Assignee: A. W. Sperry Instruments, Inc., Hauppauge, NY (US)

(*) Notice: Subject to any disclaimer, the term of this patent is extended or adjusted under 35 U.S.C. 154(b) by 0 days.

(21) Appl. No.: 10/916,234

(22) Filed: Aug. 11, 2004

(65) Prior Publication Data

US 2006/0033485 A1    Feb. 16, 2006

(51) Int. Cl.
   *G01R 19/00* (2006.01)
(52) U.S. Cl. .......................... 324/66; 324/523; 324/524
(58) Field of Classification Search ................. 324/66, 324/523, 524, 527, 528, 531
   See application file for complete search history.

(56) References Cited

U.S. PATENT DOCUMENTS

| | | | | |
|---|---|---|---|---|
| 4,345,201 | A | * | 8/1982 | Thompson et al. .......... 324/531 |
| 4,538,194 | A | * | 8/1985 | Zylstra et al. ................ 361/42 |
| 4,556,839 | A | | 12/1985 | George |
| 4,725,772 | A | * | 2/1988 | Peak ........................... 324/66 |
| 4,801,868 | A | * | 1/1989 | Brooks ......................... 324/66 |
| 5,422,564 | A | * | 6/1995 | Earle et al. .................... 324/67 |
| 5,497,094 | A | * | 3/1996 | George ......................... 324/529 |
| 5,760,591 | A | * | 6/1998 | Matsuda et al. ............. 324/524 |
| 5,969,516 | A | | 10/1999 | Wottrich |
| 6,054,931 | A | | 4/2000 | Wottrich |
| 6,154,032 | A | | 11/2000 | Coia et al. |
| 6,163,144 | A | | 12/2000 | Steber et al. |
| 6,166,532 | A | | 12/2000 | Coia et al. |
| 6,222,358 | B1 | | 4/2001 | Wottrich |
| 6,392,395 | B1 | | 5/2002 | Roberts et al. |
| 6,466,029 | B1 | | 10/2002 | Stroth et al. |
| 2001/0038289 | A1 | * | 11/2001 | Roberts et al. .............. 324/529 |
| 2002/0030476 | A1 | * | 3/2002 | Budniak et al. ............... 324/67 |
| 2002/0039026 | A1 | | 4/2002 | Stroth et al. |

FOREIGN PATENT DOCUMENTS

| | | | |
|---|---|---|---|
| BR | 1 162 811 | | 8/1969 |
| FR | 2566 539 A1 | | 12/1985 |
| GB | 2055213 A | * | 2/1981 |

* cited by examiner

*Primary Examiner*—Anjan Deb
(74) *Attorney, Agent, or Firm*—Quarles & Brady LLP

(57) ABSTRACT

The transmitter of the circuit breaker locator draws large amplitude, short duration, phase locked unipolar pulses of current from the power source at a frequency lower than that of the AC line frequency. The audible and visual indicators of the transmitter are triggered at the rate of the current pulses drawn from the AC line. The receiver of the circuit breaker locator has a pick-up coil that responds to magnetic field surrounding the circuit breaker, an amplifier for boosting the signal from the pick-up coil, and a single shot pulse stretcher triggered by the amplifier. The pulse stretcher drives both audible and visual signals, and at the same time charges a memory capacitor in a staircase generator fashion. The magnitude of the memory capacitor voltage in turn controls the gain of the amplifier. A switch controls the voltage applied to the amplifier, which increases by a predetermined amount when released.

29 Claims, 6 Drawing Sheets

DEVICE FOR LOCATING AND IDENTIFYING CIRCUIT BREAKERS

FIELD OF THE INVENTION

The present invention relates to power line testing equipment and more particularly to the identification of the circuit breakers supplying power to a particular branch circuit and AC outlets.

BACKGROUND OF THE INVENTION

When working on the electrical wiring of a home or building, it is desirable, and necessary for safety purposes to shut off the circuit breaker supplying power to a particular electrical outlet. Circuit breaker panels typically have a plurality of circuit breakers supplying power to many areas of the home. Many times, the branches these circuit breakers control are not clearly marked, and often the markings are only general in nature. Because of the marking system employed on almost all circuit breaker panels, the person desiring to remove power to a particular branch circuit or AC power outlet usually turns off many circuit breakers in the process of trying to locate the correct one. During this trial and error period, power could be removed to other locations in the home or building not related to the branch circuit the person is trying to disable. Since the AC outlet is remotely located from the breaker panel it is difficult to know for sure that the correct circuit breaker has indeed been shut-off. It then becomes necessary to go to the remote location and check to be certain that power to the AC outlet has been removed. A test or measuring device is then required to verify that the outlet power has been properly shut off, and if it is found that the incorrect circuit breaker was selected, then another trip to the breaker panel is required. It becomes obvious that a low cost easy to use device that would allow the user to identify the correct circuit breaker from the many others in the panel would be a desirable product in the marketplace.

In the past, many methods for generating the AC line signal have been devised. A very efficient, low cost transmitter and receiver is shown in U.S. Pat. No. 4,906,938. This patent shows a simple four-component transmitter that draws short duration, fast rise time pulses of high current from the AC line. Since then many others have employed variations of this circuit to generate similar signals on the AC line. These circuit variations produce signals equal to or higher than that of the AC line frequency, and are similar to signals produced by light dimmers, which also draw fast rise time current pulses from the AC line. In some cases, these light dimmers, depending on their load, can generate signals approaching the levels of those generated by the transmitter and can be difficult to distinguish from the desired transmitter signal. In fact, most of the circuit breaker receivers developed by others will respond to the signal produced by a light dimmer even when their transmitter is not plugged into an AC outlet.

U.S. Pat. No. 4,906,938 patent also shows a simple receiver for detecting the current pulses flowing through the circuit breaker. The gain of this receiver is controlled with a user adjustable potentiometer. In order to identify the correct circuit breaker the user adjusts this potentiometer, thereby reducing the gain of the receiver amplifier, until only one circuit breaker produces a response in the receiver. Although this method of adjusting the sensitivity works quite well, first time users sometimes find it difficult to adjust this control in a timely manner.

Therefore, there is a need of a power line testing equipment that allows proper detection of signals generated by the transmitter to eliminate confusion with signals produced by other sources and facilities adjustment to the sensitivity of the receiver.

SUMMARY OF THE INVENTION

Transmitter

By injecting fast rise time current pulses that have a repetition rate significantly lower than that of the line frequency, it becomes possible to distinguish the difference between a light dimmer and the transmitter. This is due to the lower frequency of the transmitted current pulses and consequently the lower repetition rate produced by the receivers audible and visual signal indicators. In addition to having transmitter current pulses lower than the AC line frequency it is also important to have unipolar pulses of current. The importance of generating current pulses during both the positive and negative portion of the AC line cycle is due to the nature of the pick-up coil and amplifier combination in the receiver. When the pick-up coil of the receiver is placed at a right angle to the circuit breaker it will produce a ring wave, this ring wave will produce slightly different positive and negative peak values when detecting a fast rise time current pulse. Due to the nature of the magnetic field produced by the current pulse in the circuit breaker, the output of the pick-up coil will be inverted by the direction of the current flowing through the breaker. Since the circuit breakers in a panel are typicality comprised of two rows with the power bus between these two rows, the circuit breakers on the left side of the panel will have current flowing from right to left, and the breakers on the right side will have current flowing from left to right. Because it would be inconvenient for the user to rotate the receiver 180 degrees, the signal developed across the pick-up coil should be the same regardless of whether the circuit breakers on the left side or the right side of the panel are being scanned. Because the receiver's amplifier responds only to the positive going peaks from the pick-up coil, the transmitter needs to generate unipolar current pulses so that the peak signal value will be the same regardless of the which side of the panel the circuit breaker is located on.

A simple, cost effective, way to generate these unipolar current pulses is with two relaxation oscillators, each controlled by a common voltage breakdown device. The first oscillator generates a current pulse only when the line voltage is positive and the second generates a current pulse only when the line voltage is negative. Because these oscillators are free running, and independent of each other, they need to be locked together. The result of locking the oscillators together insures that the signal produced by the transmitter will not cause the signal received at the circuit breaker panel to be higher than the desired six to seven pulses per second.

Since safety is extremely important, there should be no doubt, as to whether the outlet has had the power removed. Previous transmitters have a built in light that indicates that the AC outlet is receiving power, but this light is sometimes difficult to see depending on ambient lighting conditions. Additional features have been incorporated into the new transmitter that will alert the user as to whether power to the electrical outlet has, or has not, been removed. The L.E.D. used as a visual voltage indicator will now flash at the same rate as the current pulses drawn from the AC line. Additionally an audible device has been incorporated into the transmitter; this device will produce a beeping sound that will further alert the user to the fact that the AC outlet has power in the event that power has not been removed from the outlet.

Receiver

Drawing fast rise time pulses of current from the AC line will cause a signal to be present on more than one of the circuit breakers in the panel. Since many factors will effect the strength of the signal at the circuit breaker panel, the gain of the receiver must be high enough to respond to the lowest signal level anticipated. Consequently, the gain of the receiver is usually higher than necessary, and needs to be reduced in order to identify the correct circuit breaker. Since the circuit breaker supplying power to the transmitter will always have the strongest signal, reducing the receiver gain until only one breaker produces a response in the receiver is sufficient to identify the correct circuit breaker. To eliminate the need for adjusting a manual gain control, an automatic reduction in amplifier gain is accomplished using a voltage step generator. When locating a circuit breaker the user presses and holds a momentary button or switch, this allows the pulse stretching output stage of the receiver to charge a memory capacitor in a step fashion every time the receiver output stage is triggered from signals produced from the circuit breakers. The magnitude of charge on this capacitor controls a field effect transistor that in turn reduces the gain of the amplifier by a predetermined amount each time the pulse stretching output stage is triggered. In this manner, the receiver becomes less and less sensitive every time it is triggered by a signal from the circuit breakers.

The nature of the amplifier to the stepped reduction of sensitivity is such that after the output stage has been triggered five to ten times (depending on signal strength) the amplifier will no longer respond to these signals. When the amplifier stops responding to all signals emanating from the panel the user then releases the momentary button or switch they had been previously holding. Releasing the switch causes a predetermined amount of reduction, in the voltage applied to the gate of the gain controlling field effect transistor. This change in voltage then increases the gain of the receiver amplifier. This increase in gain now allows the circuit breaker having the largest signal to resume triggering the receiver. In addition to applying the gain controlling step voltage to the memory capacitor, the pulse stretching output stage of the receiver also drives a flashing light and audible beeper.

BRIEF DESCRIPTION OF THE DRAWINGS

Preferred embodiments of the present invention have been chosen for purposes of illustration and description and are shown in the accompanying drawings forming a part of the specification wherein.

DETAILED DESCRIPTION OF THE PREFERRED EMBODIMENTS

Figure 1:
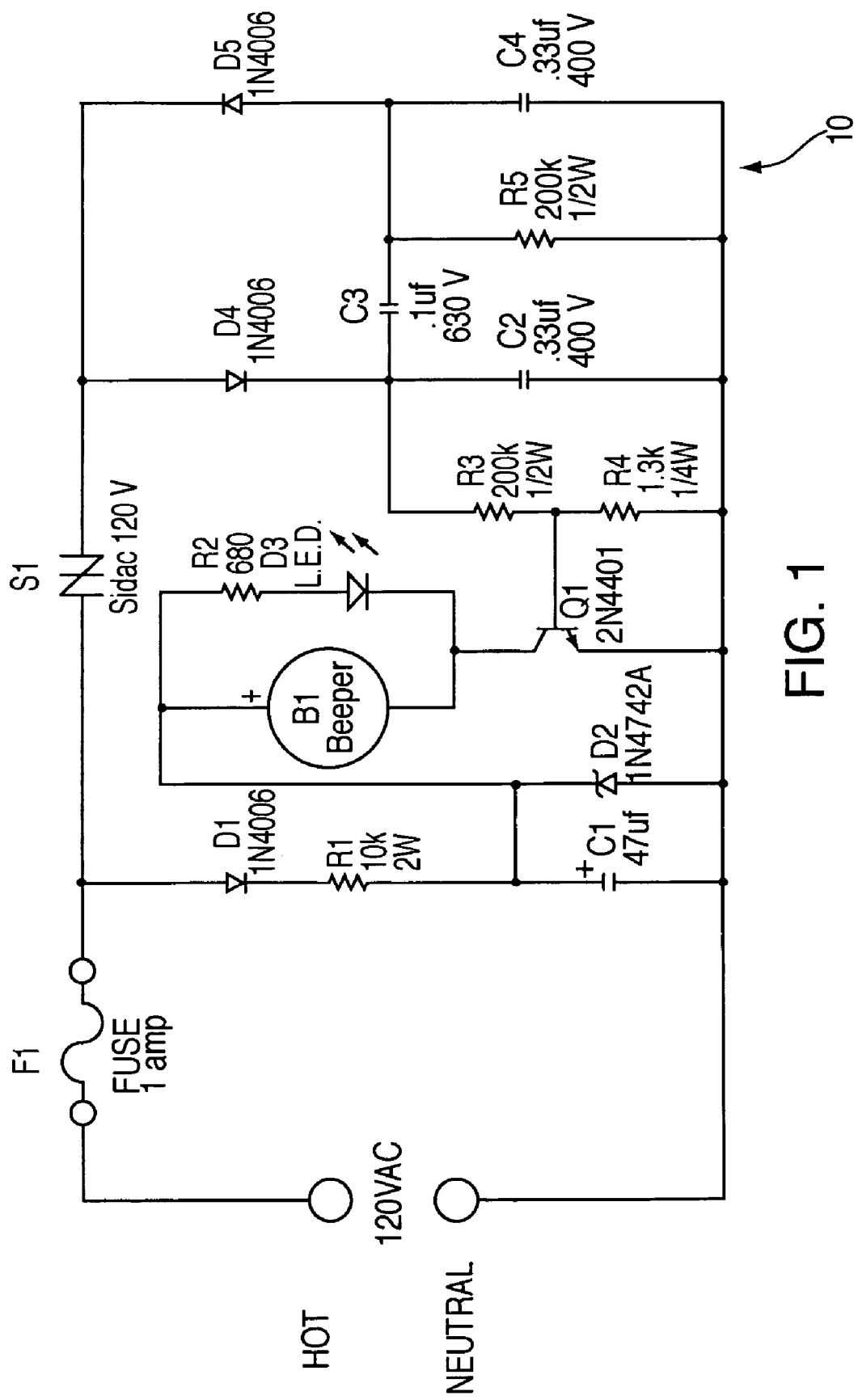
FIG. 1 shows a schematic of the preferred transmitter.
Figure 2:
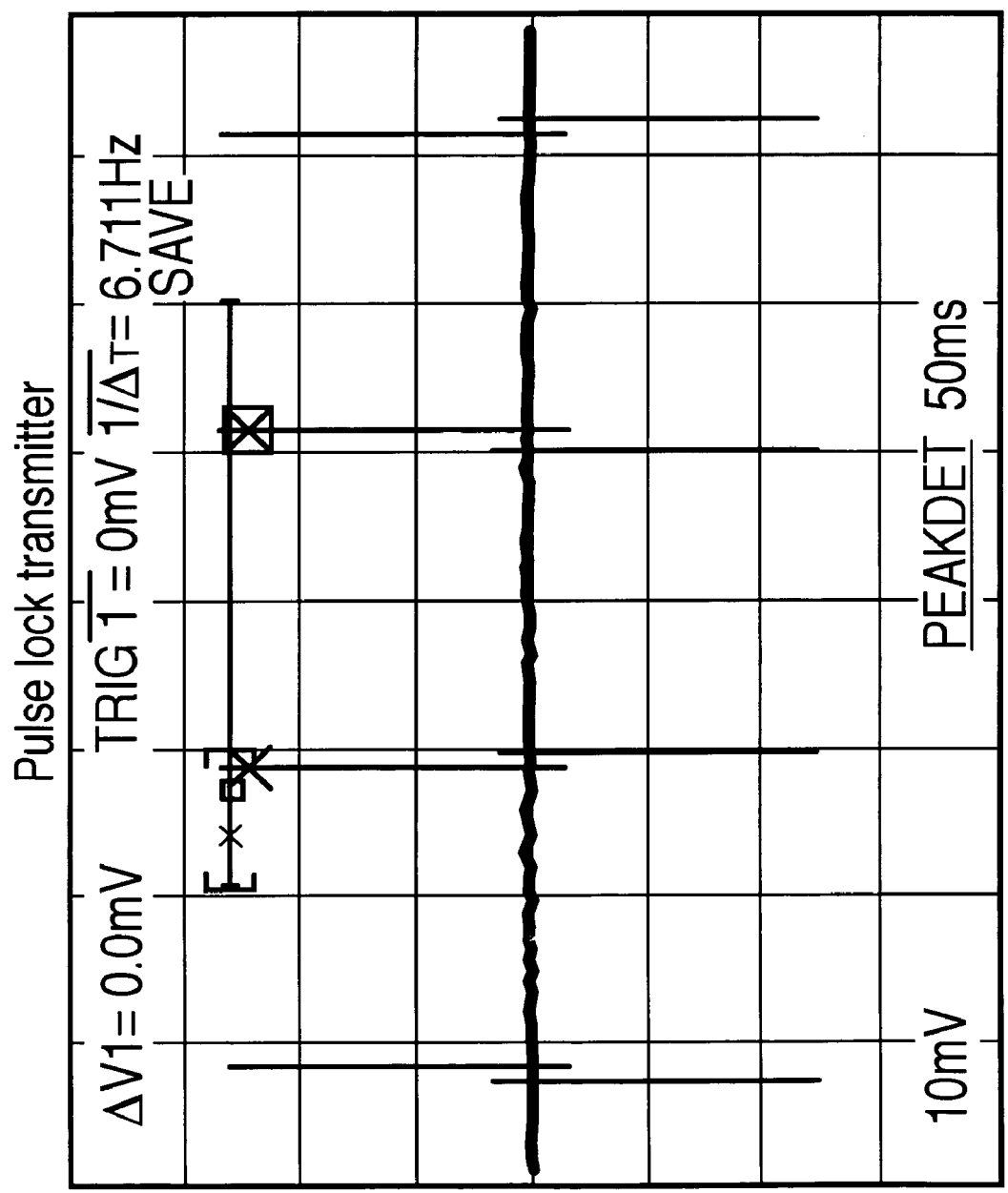
FIG. 2 shows the line current waveforms produced by the transmitter of FIG. 1.
Figure 3:
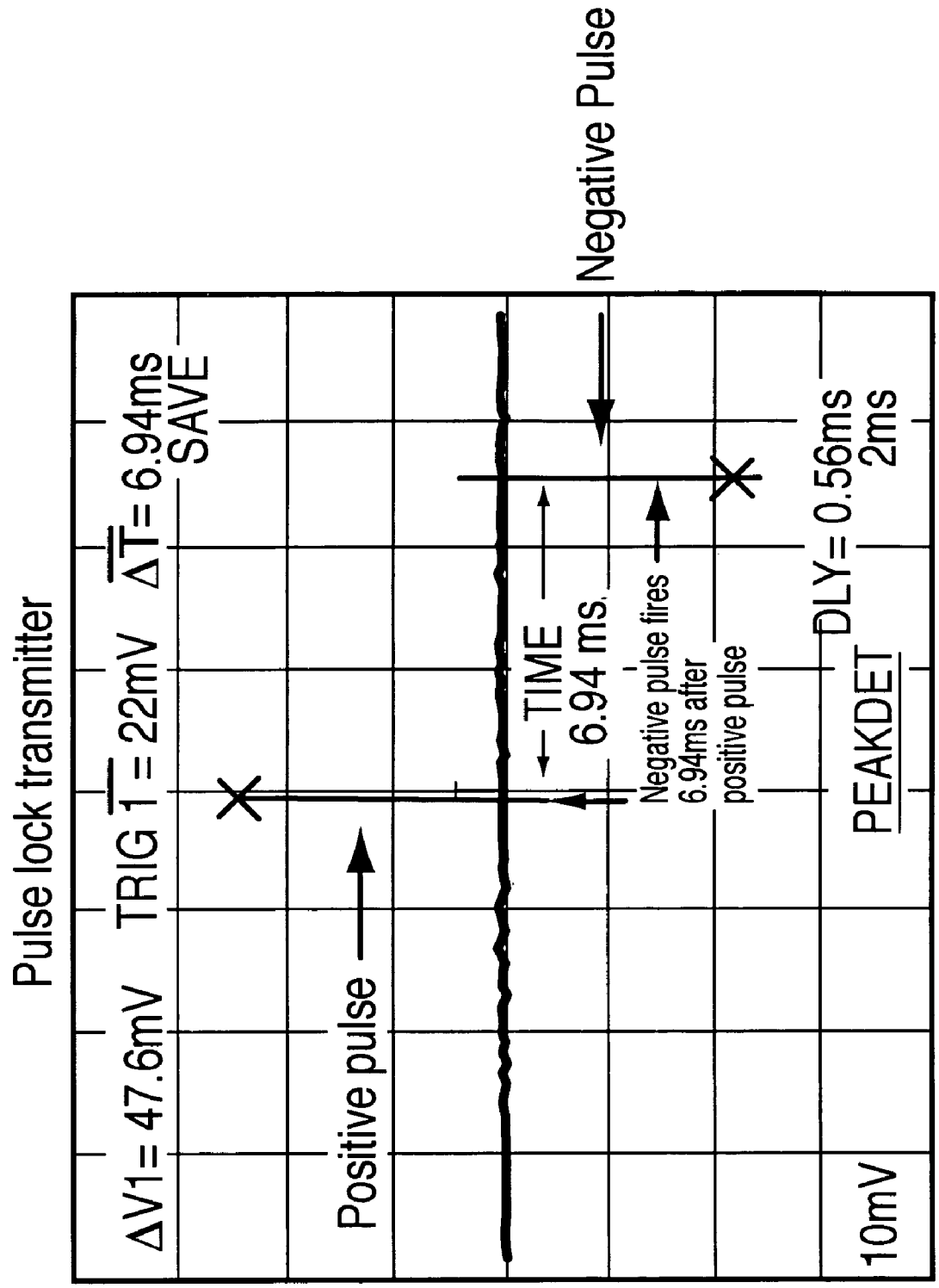
FIG. 3 shows the relationship of the positive and negative transmitter pulses.

With reference to the drawings, wherein the same reference number indicates the same element throughout, there is shown in FIG. 1 a schematic of the pulse-generating transmitter 10. Transmitter 10 is adapted for use with a standard AC receptacle powered from one of the branch circuits supplied by a circuit breaker panel.

Transmitter 10

AC line voltage is applied to fuse F1, the junction of F1, S1 and D1 have Hot AC line voltage present with respect to the AC Neutral return connection. The series combination of D1 and R1 form a half wave current limited source for charging capacitor C1, the magnitude of this voltage is limited by zener diode D2. The resulting voltage at the junction of R1, C1, and D2 produces a DC supply for powering beeper B1 and light emitting diode (LED) D3, current through LED D3 is further limited by resistor R2. Transistor Q1 is configured as a voltage controlled switch, when this switch is in conduction its collector emitter creates a path to circuit common, that turns on beeper B1 and LED D3. The combination of S1, D4, C2, R3, and R4 form a first relaxation oscillator that draws positive going pulses of current from the AC line at approximately 7 Hz. The combination of S1, D5, C4, and R5 form a second relaxation oscillator that draws negative going pulses of current from the AC line at approximately 7 Hz. Because these two relaxation oscillators are free running, it becomes necessary to synchronized them to each other. The result of this synchronization is that within one-half of a line cycle after one of the relaxation oscillators has generated a pulse the other oscillator will also generate a pulse of the opposite polarity. This synchronization is accomplished by coupling the two oscillators together with capacitor C3.

Figure 4:
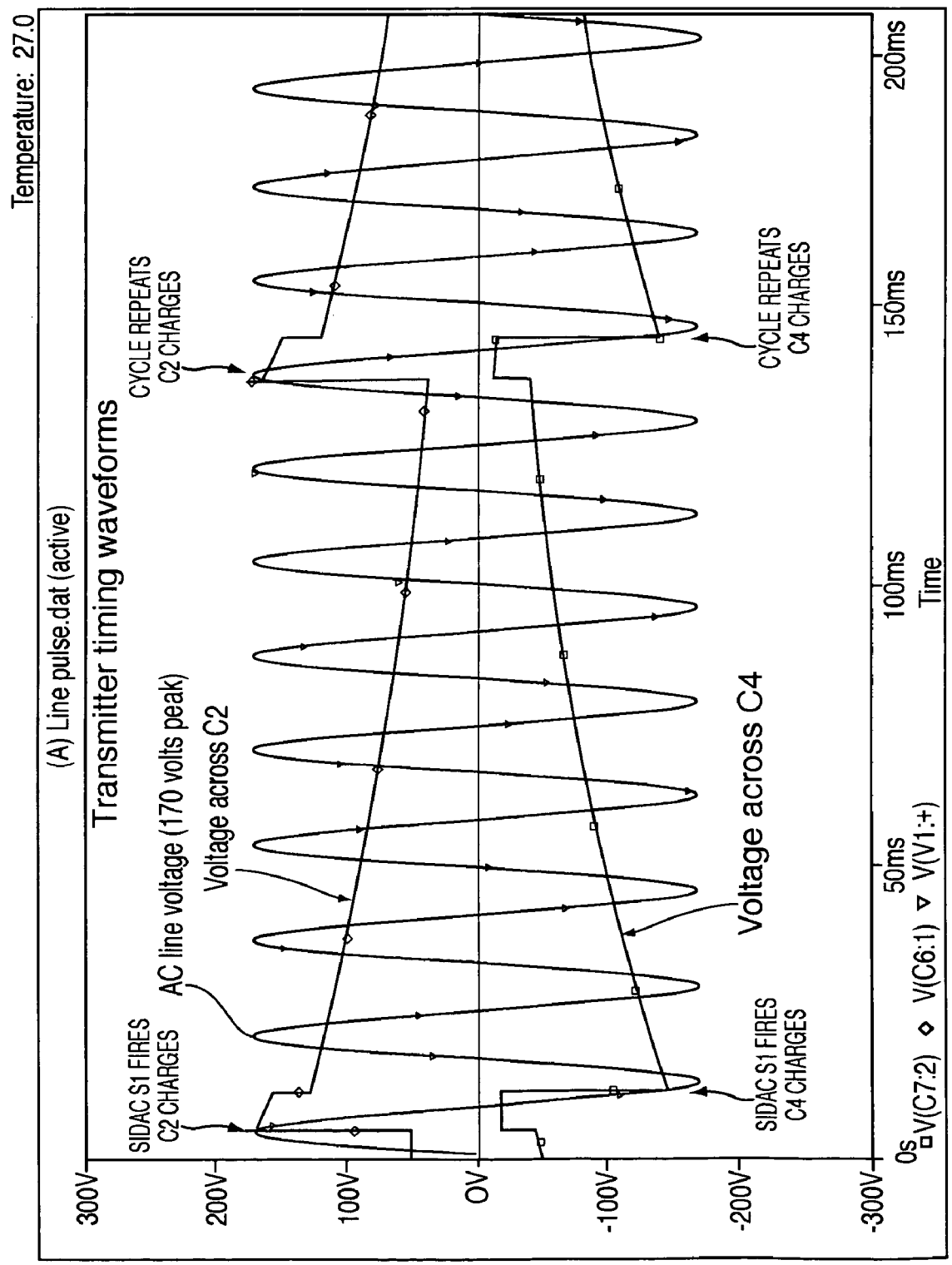
FIG. 4 shows the transmitter timing waveforms of FIG. 1.

Sidac S1 is a bi-directional voltage breakdown device, when the voltage across it exceeds its breakdown rating it becomes conductive, and remains conductive until the current flowing through it drops below the rating of its holding current. Referring to FIG. 4, during the positive portion of the AC line cycle, the voltage across sidac S1 exceeds the breakdown rating of the device (approximately 120 volts). At this time, sidac S1 switches from an off state to an on state and connects the AC line to diode D4, this diode becomes forward biased causing the rapid charging of capacitor C2. During the rapid charging of capacitor C2 a pulse of current with a peak value of approximately 15 amperes is drawn from the AC line during the positive portion of the AC line cycle, this in turn causes the voltage across capacitor C2 to charge in a positive direction. The charging of C2 creates a voltage step change across this capacitor equal to the 120-volt breakdown voltage of sidac S1. This 120-volt pulse will also appear across capacitors C3 and C4 since they are series connected across C2. Since the ratio of C3 to C4 is 3.3 to 1, a positive going step chance across capacitor C4 of approximately 40 volts will occur at this time. This voltage step across C4 has the effect of lowering the voltage across it by 40 volts. This lowering of voltage across C4 insures that during the next negative going portion of the AC line cycle, the voltage breakdown rating of sidac Si will be exceeded, causing diode D5 to become conductive. Capacitor C4 will then rapidly charge in a negative direction, at this time a 15-ampere pulse of current will be drawn from the AC line during the negative half of the line cycle. This current pulse will occur during the next negative half line cycle immediately following the turn on of sidac S1 during the previous positive half of the line cycle. The discharging effect of resistors R5, and series connected resistors R3 and R4 causes a slow decay in voltage across C2 and C4, and after approximately 143 ms has elapsed the cycle described above will repeat. As can be seen from the voltage waveform in FIG. 4, the voltage across capacitor C2 will reach a peak value of approximately 170 volts when sidac S1 fires. The resistor divider comprised of R3, R4 form a voltage divider, and the voltage at the junction of these resistors will be sufficient to forward bias the base emitter junction of Q1. Q1 will then turn on and remain on until the voltage across C2 drops to approximately 95 volts at which time Q1 will turn off. Thus every time C2 is recharged by the firing sidac S1, transistor Q1 will turn on for approximately 4 ms. The turning on of Q1 in turn causes beeper B1 and LED D3 to provide visual and audible indications to the user that the outlet is receiving power from the AC outlet.

Receiver 20

Figure 5:
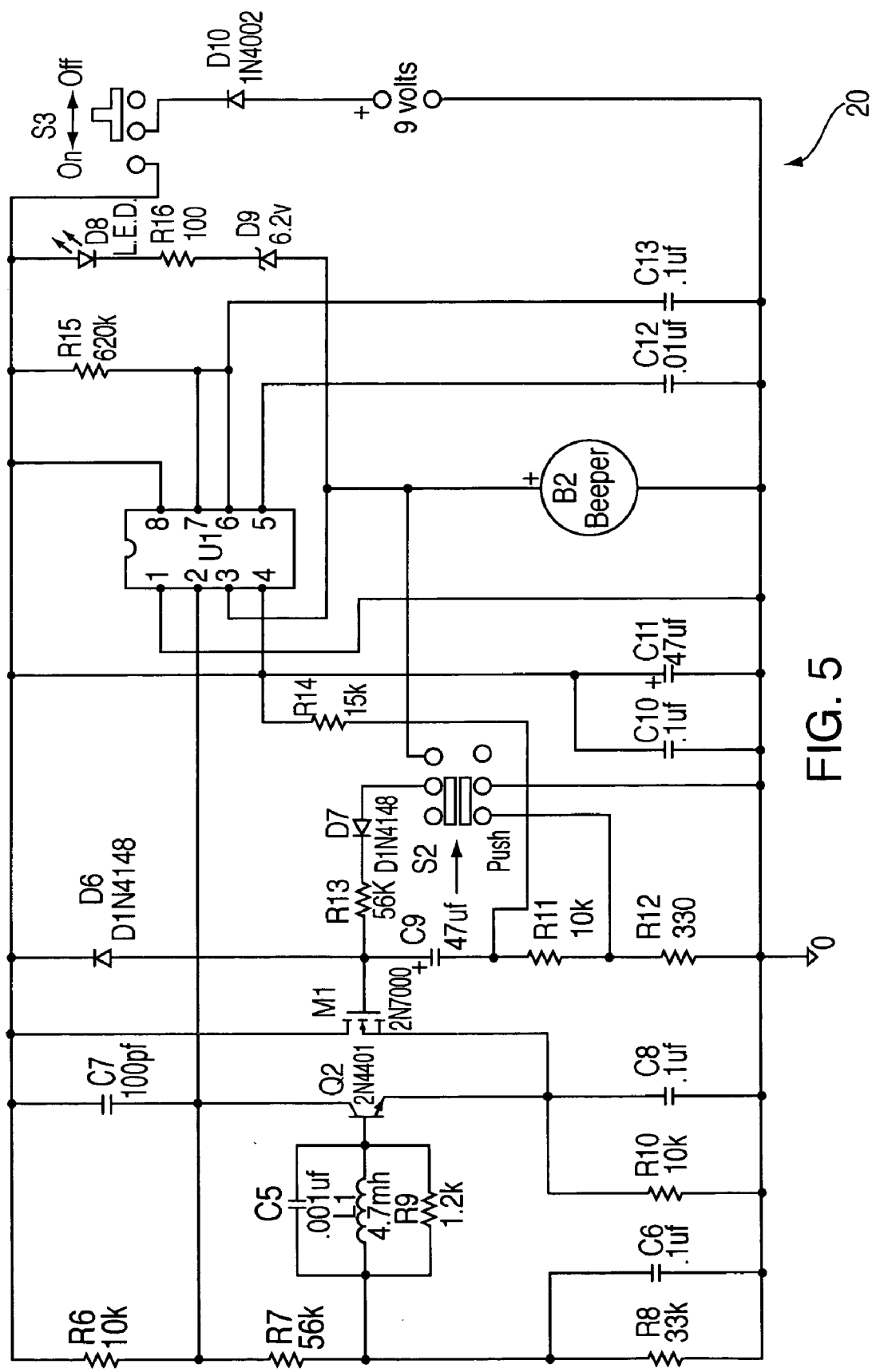
FIG. 5 shows a schematic of the preferred receiver.

FIG. 5 is a schematic of the receiver 20. The combination of C5, L1, and R9 will produce a 90 kHz ring wave when L1 is placed at a right angle to a wire or circuit breaker carrying a fast rise-time impulse of current. In this case, the current impulse from the transmitter 10 produces a current that has a peak value of approximately 15 amperes with a rise time of approximately 2 to 3 microseconds. Resistors R6, R7, and R8 form a voltage divider, this in turn supplies the necessary DC base bias that flows through L1 into the base of transistor Q2. When detecting a current pulse, one side of pick-up coil L1 sees a low impedance AC path to circuit common through capacitor C6 while the other side of the coil is free to supply a signal to the base of amplifier Q2. Resistor R6 in addition to being part of the base bias network for Q2 also serves as a collector load resistor. When the base of Q2 receives a signal from the pick-up coil, transistor Q2 will turn on causing a negative going voltage drop at the junction of R6 and the collector of Q2. If the signal produced by L1 is sufficient, the negative going voltage drop at the collector of Q2 will fall to a value below one third of the 8.5-volt DC supply voltage. U1 is a 555 timer integrated circuit (IC) configured as a single shot pulse stretcher; pin 2 of this IC is the trigger control input and is connected to the junction of R6 and the collector of Q2. When the voltage applied to pin 2 of U1 falls below one third of the supply voltage the output of the IC, pin 3, will be driven high by its internal switches. When not triggered, the output of IC U1 will be low, this creates a path to circuit common for LED D8 through current limiting resistor R16 and zener diode D9. The value of zener diode D9 is chosen to come out of conduction if the battery voltage drops below 8 volts, thus LED D8 will cease to light if the battery voltage is low, thus serving as a low battery indicator. When the battery voltage is normal, LED D8 will flash on and off in time with the switching at the pin 3 output of U1. The output pin 3 of U1 is also connected to an audible beeper B2. The timing interval produced at the output of U1 is controlled by the values of R15 and C14. When pin 3 is forced high by the negative going trigger pulse applied to pin 2, it remains high for 68 ms. During this timing interval, beeper B2 is energized and LED D8 de-energized.

The purpose of field effect transistor M1 is to control the sensitivity of signal amplifier transistor Q2. When M1 is not in conduction the voltage at the emitter of Q2 is 1.72 volts. If the emitter voltage of Q2 is forced to increase, it has the effect of reverse biasing the base emitter junction, thus the sensitivity of Q2 to the signal produced by pick-up coil L1 can be reduced by increasing the voltage applied to its emitter. While switch S2 is not depressed, the voltage across memory capacitor C9 remains near zero and the receiver's 20 amplifier Q2 operates at maximum sensitivity. When switch S2 is pressed, the output pulses produced by U1 at pin 3 are connected to the anode of diode D7. During the positive portion of these pulses diode D7 is forward biased and charging current flows through current limiting resistor R13 into memory capacitor C9, resistor R11 also has an effect on limiting the current flowing into C9. Additionally, resistor R11 is part of a voltage divider that establishes a positive voltage reference for the gate of M1 with respect to circuit common. The values for R14 and R11 are chosen to produce 3.3 volts at the junction of memory capacitor C9, resistor R14, and resistor R11. Resistor R12 is normally shorted by a second section on switch S2, when S2 is pushed the short is removed, and 100 mV appears across this resistor R7. This additional 100 mV adds to the voltage already present at the gate of M1 and in turn causes the voltage present at the emitter of Q2 to increase by an additional 100 mV.

Figure 6:
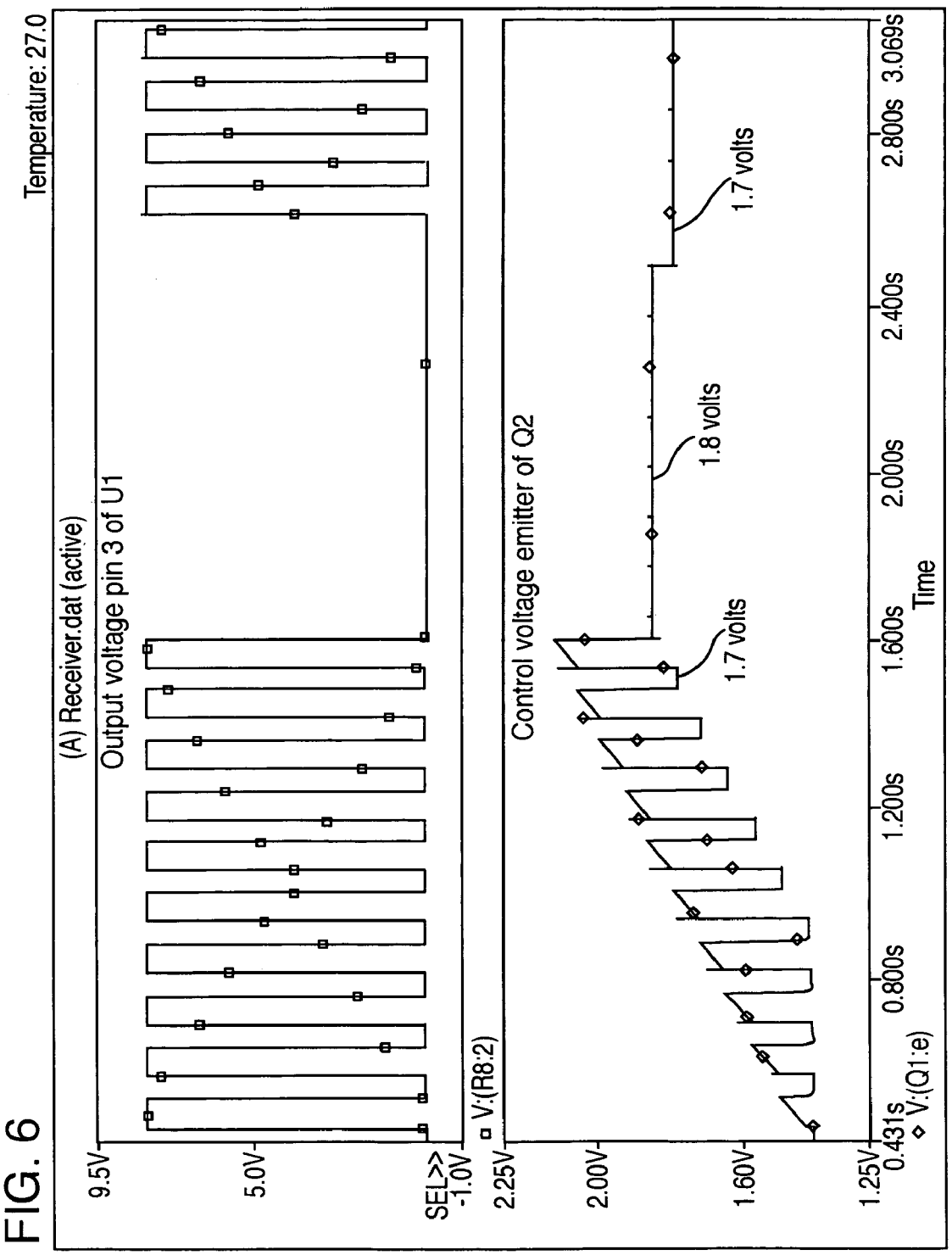
FIG. 6 shows the step voltage controlling the gain of the receiver amplifier of FIG. 5.

The waveforms shown in FIG. 6 show the relationship of the pin 3 output voltage of U1 (upper waveform) to the stepped voltage applied to the emitter of signal amplifier Q2. The conditions shown in the graph waveforms of FIG. 6 are as follows: The upper waveform is the pin 3 output voltage of U1; the lower waveform is the stepped sensitivity control voltage, applied to the emitter of signal amplifier Q2. At time zero the receiver 20 is being triggered by a signal from pick-up coil L1, 0.5 seconds into the plot switch S2 is pressed and the voltage applied to the emitter of Q2 begins to increase by approximately 100 mV every time the output of U1 at pin 3 goes high. When the voltage steps applied to the emitter of Q2 are sufficiently high to reverse bias the emitter base junction of Q2, the negative going voltage pulse at Q2's collector no longer falls below that required to trigger U1. At this time, the output voltage of U1 remains low and the voltage at Q2's emitter stops increasing. As long as the output voltage of U1 remains low, beeper B2 is off and LED D8 ceases to flash. When none of the circuit breakers in the panel causes the receiver 20 to respond, the user would release switch S2 (shown as 2.5 seconds on the graph), this will cause a 100 mV drop in the voltage applied to the emitter of Q2. This drop in voltage will now allow the signal amplifier to resume responding to the signal from pick-up coil L1, but at a now reduced sensitivity level such that only the circuit breaker with the strongest signal is capable of triggering the receiver 20. When the receiver 20 power is shut-off with switch S3, the DC voltage in the receiver 20 will rapidly collapse to zero. This will in turn cause memory capacitor C9 to discharge through diode D6 thus resetting C9 to an un-charged condition.

The features of the invention illustrated and described herein is the preferred embodiment. Therefore, it is understood that the appended claims are intended to cover the variations disclosed and unforeseeable embodiments with insubstantial differences that are within the spirit of the claims.

What I claim is:

1. A device for identifying a circuit interrupter for an AC power line circuit among a plurality of similar circuit interrupters, said AC power line having a line frequency, comprising:
    a. a transmitter comprises means for generating positive signal pulses and negative signal pulses in a selected energized power line circuit and means for synchronizing said signal pulses to each other, said signal pulses having a frequency lower than the line frequency; and
    b. a receiver comprises means for detecting said signal pulses.

2. The device of claim 1 wherein said AC power line further having a line voltage comprises positive line voltage and negative line voltage, said generating means comprises first and second relaxation oscillators, wherein said first relaxation oscillator generates said positive signal pulses in response to positive AC line voltage and said relaxation oscillator generates said negative signal pulses in response to negative AC line voltage.

3. The device of claim 1 wherein said signal pulses having a frequency substantially lower than the line frequency.

4. The device of claim 1 wherein said transmitter further comprises indicator means to indicate the presence of power in the selected power line circuit.

5. The device of claim 4 wherein said indicator means comprises an audio indicator.

6. The device of claim 5 wherein said audio indicator produces an alternating on-off beep at said frequency of said signal pulses.

7. The device of claim 4 wherein said indicator means comprises a visual indicator.

8. The device of claim 7 wherein said visual indicator produces an alternating on-off blinking light at said frequency of said signal pulses.

9. The device of claim 1 wherein said receiver further comprises signal means for signaling the presence of said signal pulses.

10. The device of claim 9 wherein said detecting means further comprises an amplifier means.

11. The device of claim 9 wherein said detecting means having an adjustable sensitivity, said receiver further comprises means for automatically adjusting said sensitivity of said detecting means.

12. The device of claim 11 wherein said automatically adjusting means comprises a voltage step generator and a memory means.

13. The device of claim 10 wherein said amplifier means having an adjustable gain, said receiver further comprises means for automatically adjusting said gain of said amplifier means.

14. The device of claim 11 wherein said automatically adjusting means comprises a desensitizing circuit and a switch, wherein upon actuation of said switch, said desensitizing circuit desensitizes said detecting means by a progressively decreasing predetermined increment until said signal means ceases to respond to the presence of said signal pulses, and upon deactuation of said switch, said desensitizing circuit increases said sensitivity of said detecting means by the predetermined increment such that the presence of said signal pulses is again detected by said detecting means.

15. The device of claim 13 wherein said automatically adjusting means comprises a desensitizing circuit and a switch, wherein upon actuation of said switch, said desensitizing circuit reduces said gain of said amplifier means by a progressively decreasing predetermined increment until said signal means ceases to respond to the presence of said signal pulses, and upon deactuation of said switch, said desensitizing circuit increases said gain of said amplifier means by the predetermined increment such that the presence of said signal pulses is again detected by said detecting means.

16. The device of claim 9 wherein said signal means comprises an audio signal.

17. The device of claim 16 wherein said audio signal produces an alternating on-off beep at the frequency of said signal pulses.

18. The device of claim 9 wherein said signal means comprises a visual signal.

19. The device of claim 18 wherein said signal produces an alternating on-off blinking light at said frequency of said signal pulses.

20. The device of claim 18, wherein said visual signal produces a steady light.

21. A device for identifying a circuit interrupter for an AC power line circuit among a plurality of similar circuit interrupters, comprising:
  a. a transmitter comprises means for generating positive signal pulses and negative signal pulses in a selected energized power line circuit; and
  b. a receiver comprises means for detecting said signal pulses, said detecting means having an adjustable sensitivity, and means for automatically adjusting said sensitivity of said detecting means.

22. A method of identifying a circuit interrupter for an AC power line circuit among a plurality of similar circuit interrupters, said AC power line having a line frequency, comprising the steps of:
  a. providing a transmitter means for generating positive signal pulses and negative signal pulses having a frequency lower than the line frequency in a selected energized power line circuit;
  b. providing means for synchronizing said signal pulses to each other; and
  c. providing a receiver having means for detecting said signal pulses.

23. The method of claim 22 wherein said AC power line further having a line voltage comprises positive line voltage and negative line voltage, said transmitter means comprises first and second relaxation oscillators, said first relaxation oscillator generates said positive signal pulses in response to positive AC line voltage and said second relaxation oscillator generates said negative signal pulses in response to negative AC line voltage.

24. The method of claim 22 wherein said detecting means having an adjustable sensitivity, further comprising the step of providing means for automatically adjusting said sensitivity of said detecting means.

25. A device for identifying a circuit interrupter for an AC power line circuit among a plurality of similar circuit interrupters, said AC power line having a line frequency, comprising:
  a. a transmitter that generates synchronized positive signal pulses and negative signal pulses in a selected energized power line circuit, the signal pulses having a frequency lower than the line frequency; and
  b. a receiver that detects the signal pulses.

26. The device of claim 25 wherein the AC power line further has a line voltage comprising positive line voltage and negative line voltage, the transmitter further comprising a first relaxation oscillator and a second relaxation oscillator, wherein the first relaxation oscillator generates the positive signal pulses in response to positive AC line voltage and the relaxation oscillator generates the negative signal pulses in response to negative AC line voltage.

27. The device of claim 25 wherein the receiver has a sensitivity and the receiver is configured to automatically adjust the sensitivity.

28. A device for identifying a circuit interrupter for an AC power line circuit among a plurality of similar circuit interrupters, said AC power line having a line frequency, comprising:
  a. a transmitter comprises means for generating unipolar signal pulses in a selected power line circuit and means for synchronizing said signal pulses to each other, said signal pulses having a frequency lower than the line frequency; and
  b. a receiver comprises means for detecting said signal pulses;

wherein said AC power line further having a line voltage comprises positive line voltage and negative line voltage, said generating means comprises first and second relaxation oscillators, wherein said first relaxation oscillator generates positive signal pulses in response to positive AC line voltage and said relaxation oscillator generates negative signal pulses in response to negative AC line voltage.

29. A method of identifying a circuit interrupter for an AC power line circuit among a plurality of similar circuit interrupters, said AC power line having a line frequency, comprising the steps of:
   a. providing a transmitter means for generating unipolar signal pulses having a frequency lower than the line frequency in a selected power line circuit;
   b. providing means for synchronizing said signal pulses to each other; and
   c. providing a receiver having means for detecting said signal pulses;

wherein said AC power line further having a line voltage comprises positive line voltage and negative line voltage, said transmitter means comprises first and second relaxation oscillators, said first relaxation oscillator generates positive signal pulses in response to positive AC line voltage and said second relaxation oscillator generates negative signal pulses in response to negative AC line voltage.

\* \* \* \* \*